United States Patent
Iwasaki et al.

(10) Patent No.: US 9,202,706 B2
(45) Date of Patent: Dec. 1, 2015

(54) METHOD OF FORMING PATTERN AND SOLID-STATE IMAGE SENSOR DEVICE

(71) Applicant: Tokyo Electron Limited, Tokyo (JP)

(72) Inventors: Takahisa Iwasaki, Miyagi (JP); Hideyuki Hatoh, Miyagi (JP); Yoshisato Oikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 84 days.

(21) Appl. No.: 13/960,012

(22) Filed: Aug. 6, 2013

(65) Prior Publication Data

US 2014/0042583 A1 Feb. 13, 2014

(30) Foreign Application Priority Data

Aug. 8, 2012 (JP) ................. 2012-176282

(51) Int. Cl.
*H01L 27/146* (2006.01)
*H01L 21/00* (2006.01)
*H01L 21/3065* (2006.01)
*H01L 21/02* (2006.01)
*H01J 37/32* (2006.01)

(52) U.S. Cl.
CPC ...... *H01L 21/3065* (2013.01); *H01L 21/02057* (2013.01); *H01L 27/1463* (2013.01); *H01L 27/14685* (2013.01); *H01J 37/3266* (2013.01); *H01J 37/32091* (2013.01)

(58) Field of Classification Search
CPC ... H01L 27/30; H01L 27/3239; H01L 31/143; H01L 31/162; H01L 33/08; H01L 33/18; H01L 33/24; H01L 51/5032; H01L 25/048; H01L 27/288; H01L 27/32
USPC ................ 438/22–47, 69, 493, 503, 507, 956
See application file for complete search history.

(56) References Cited

U.S. PATENT DOCUMENTS

| | | | |
|---|---|---|---|
| 2008/0050923 A1* | 2/2008 | Kim | ................. H01L 21/02087 438/706 |
| 2008/0216957 A1* | 9/2008 | Ogasawara et al. | ...... 156/345.29 |
| 2011/0019050 A1* | 1/2011 | Yamashita | .................... 348/308 |
| 2011/0020707 A1* | 1/2011 | Uchida | ....................... 429/231.8 |
| 2011/0114113 A1* | 5/2011 | Honda et al. | ................... 134/1.1 |
| 2012/0033119 A1* | 2/2012 | Shinohara | ..................... 348/302 |

FOREIGN PATENT DOCUMENTS

| | | |
|---|---|---|
| JP | 2007-329336 | 12/2007 |
| JP | 2012-038981 | 2/2012 |

* cited by examiner

*Primary Examiner* — Selim Ahmed
*Assistant Examiner* — Moin Rahman
(74) *Attorney, Agent, or Firm* — Ipusa, PLLC

(57) ABSTRACT

A method of forming a pattern on a silicon layer of a substrate, to be processed, wherein a semiconductor device is formed at a front surface side of the substrate that is supported by a support substrate at the front surface side, includes an etching step of etching the substrate by plasma via a mask having a predetermined pattern formed at a back surface side of the silicon layer of the substrate; and a cleaning step of cleaning the substrate by plasma using cleaning gas obtained by mixing CF series gas and inert-gas, after the etching step.

5 Claims, 14 Drawing Sheets

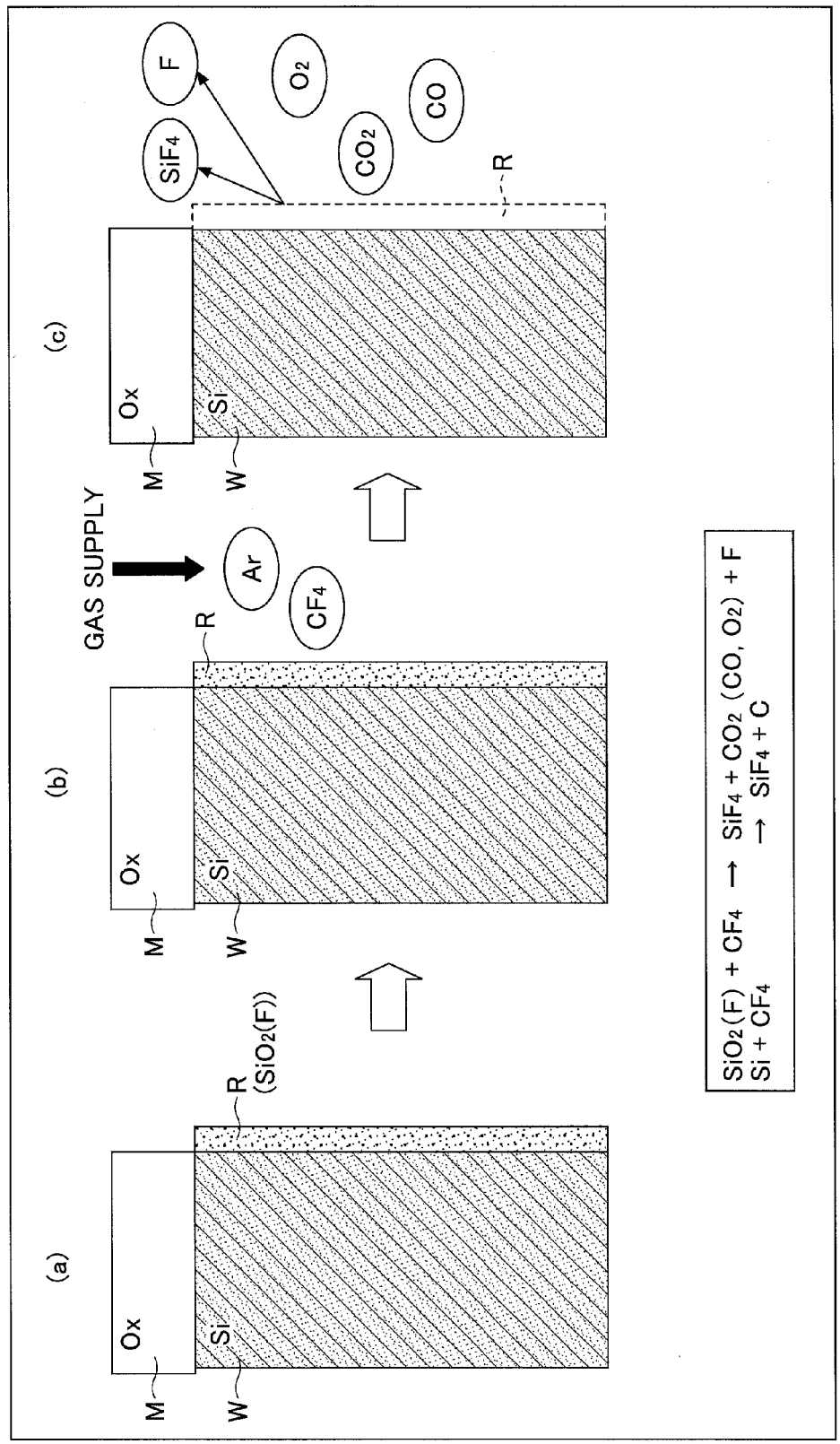

| | CENTER | EDGE |
|---|---|---|
| Si DEPTH($\mu m$) | 4.01 | 3.90 |
| TOP CD | 0.179 | 0.183 |
| MAX CD | 0.222 | 0.218 |
| BOTTOM CD | 0.183 | 0.198 |

(b)
HF 500W

| | CENTER | EDGE |
|---|---|---|
| Si DEPTH($\mu m$) | 4.19 | 4.04 |
| TOP CD | 0.206 | 0.206 |
| MAX CD | 0.262 | 0.246 |
| BOTTOM CD | 0.246 | 0.246 |

(c)
HF 1000W

| | CENTER | EDGE |
|---|---|---|
| Si DEPTH($\mu m$) | 4.19 | 4.09 |
| TOP CD | 0.202 | 0.234 |
| MAX CD | 0.278 | 0.266 |
| BOTTOM CD | 0.262 | 0.270 |

(d)
HF 1500W

| | CENTER | EDGE |
|---|---|---|
| Si DEPTH($\mu m$) | 4.33 | 4.19 |
| TOP CD | 0.226 | 0.222 |
| MAX CD | 0.286 | 0.274 |
| BOTTOM CD | 0.274 | 0.270 |

(e)
HF 2000W

| | CENTER | EDGE |
|---|---|---|
| Si DEPTH($\mu m$) | 4.51 | 4.40 |
| TOP CD | 0.250 | 0.294 |
| MAX CD | 0.305 | 0.302 |
| BOTTOM CD | 0.290 | 0.294 |

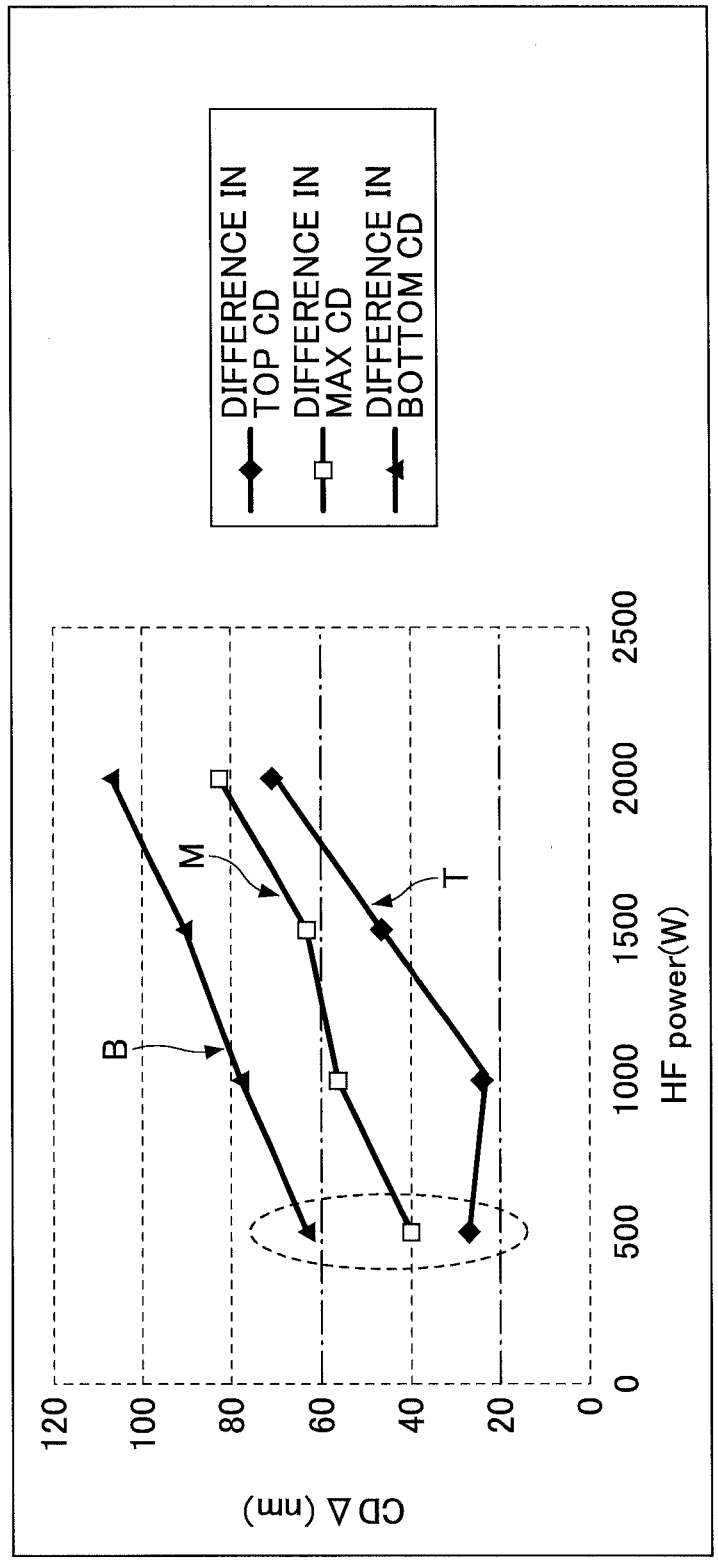

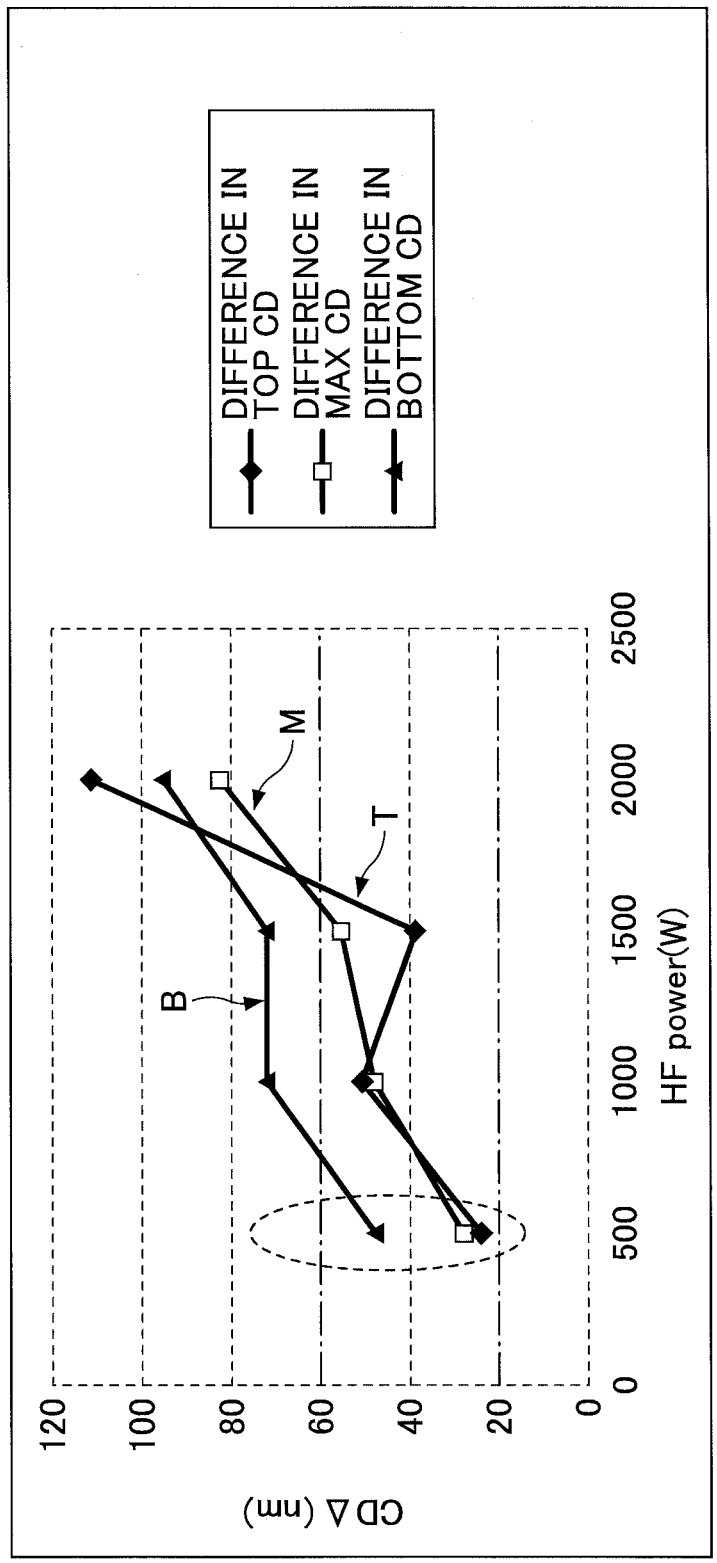

(a)

|  | CENTER | EDGE |
|---|---|---|
| Si DEPTH($\mu$m) | 3.88 | 3.72 |
| TOP CD | 0.17 | 0.18 |
| MAX CD | 0.20 | 0.19 |
| BOTTOM CD | 0.19 | 0.18 |

(b) Ar(SINGLE GAS) 5min

|  | CENTER | EDGE |
|---|---|---|
| Si DEPTH($\mu$m) | 4.11 | 3.90 |
| TOP CD | 0.166 | 0.175 |
| MAX CD | 0.242 | 0.230 |
| BOTTOM CD | 0.218 | 0.147 |

(c) HBr(SINGLE GAS) 1min

|  | CENTER | EDGE |
|---|---|---|
| Si DEPTH($\mu$m) | 4.34 | 4.37 |
| TOP CD | 0.182 | 0.202 |
| MAX CD | 0.222 | 0.238 |
| BOTTOM CD | 0.206 | 0.218 |

(d) $CF_4$/Ar(MIX GAS) 1min

|  | CENTER | EDGE |
|---|---|---|
| Si DEPTH($\mu$m) | 4.51 | 4.40 |
| TOP CD | 0.250 | 0.294 |
| MAX CD | 0.305 | 0.302 |
| BOTTOM CD | 0.290 | 0.294 |

FIG.12

METHOD OF FORMING PATTERN AND SOLID-STATE IMAGE SENSOR DEVICE

CROSS-REFERENCE TO RELATED APPLICATION

The present application is based on and claims the benefit of priority of Japanese Priority Application No. 2012-176282 filed on Aug. 8, 2012, the entire contents of which are hereby incorporated herein by reference.

BACKGROUND OF THE INVENTION

1. Field of the Invention

The present invention relates to a method of forming a pattern and a solid-state image sensor device.

2. Description of the Related Art

A CMOS image sensor (a CMOS solid-state image sensor device) is configured by forming a unit pixel by a photodiode that functions as a light receiving unit and a plurality of pixel transistors, and two-dimensionally arranging a plurality of the unit pixels (see Patent Documents 1 and 2, for example). It is important to suppress color mixture caused by a leakage of a photo-electrically converted electric charge to adjacent pixels in the CMOS image sensor. Thus, a method has been suggested in which an element isolation region that physically isolates the unit pixels is formed in a silicon layer of a substrate to suppress the leakage of the electric charge to the adjacent pixels.

However, when forming the element isolation region by etching, there may be a case where an interface state is generated, due to a residual product at an etching interface, to cause a generation of a white point. Further, there is a possibility that an electrical noise is generated in a device due to a fluorine (F) component in the residual product deposited at the etching interface. Thus, it is necessary to remove the residual component, particularly the fluorine residual component, deposited at the etching interface after the etching step.

Here, a cleaning method using wet etching may be considered to remove the fluorine residual component. However, if wet etching is performed after the etching step, for a structure in which a substrate, on which the unit pixels are formed, and a support substrate are bonded, there may be a case where an adhesive agent bonding the substrate and the support substrate dissolves.

Further, a cleaning method may be considered in which the fluorine residual component deposited at the etching interface is vaporized by heat treatment. However, for the above described bonded structure, there may be a concern that the unit pixels formed on the substrate are damaged by the heat treatment.

PATENT DOCUMENTS

[Patent Document 1] Japanese Laid-open Patent Publication No. 2007-329336
[Patent Document 2] Japanese Laid-open Patent Publication No. 2012-38981

SUMMARY OF THE INVENTION

The present invention is made in light of the above problems, and provides a method of forming a pattern and a solid-state image sensor device capable of removing a residual product including a fluorine (F) component generated by etching without causing damage.

According to an embodiment, there is provided a method of forming a pattern on a silicon layer of a substrate, to be processed, wherein a semiconductor device is formed at a front surface side of the substrate that is supported by a support substrate at the front surface side, including an etching step of etching the substrate by plasma via a mask having a predetermined pattern formed at a back surface side of the silicon layer of the substrate; and a cleaning step of cleaning the substrate by plasma using cleaning gas obtained by mixing CF series gas and inert-gas, after the etching step.

According to another embodiment, there is provided a solid-state image sensor device manufactured by the method of forming the pattern.

BRIEF DESCRIPTION OF THE DRAWINGS

Other objects, features and advantages of the present invention will become more apparent from the following detailed description when read in conjunction with the accompanying drawings.

FIG. 6 is a view illustrating a reaction model of a cleaning step of the embodiment;

FIG. 8 is a view illustrating CD values before and after the cleaning step illustrated in FIG. 7;

FIG. 9A and FIG. 9B are graphs illustrating dependency on high frequency of the CD values (difference) before and after the cleaning step illustrated in FIG. 7;

FIG. 12 illustrates views indicating CD values before and after the cleaning step illustrated in FIG. 11.

DETAILED DESCRIPTION OF THE PREFERRED EMBODIMENTS

Figure 1:
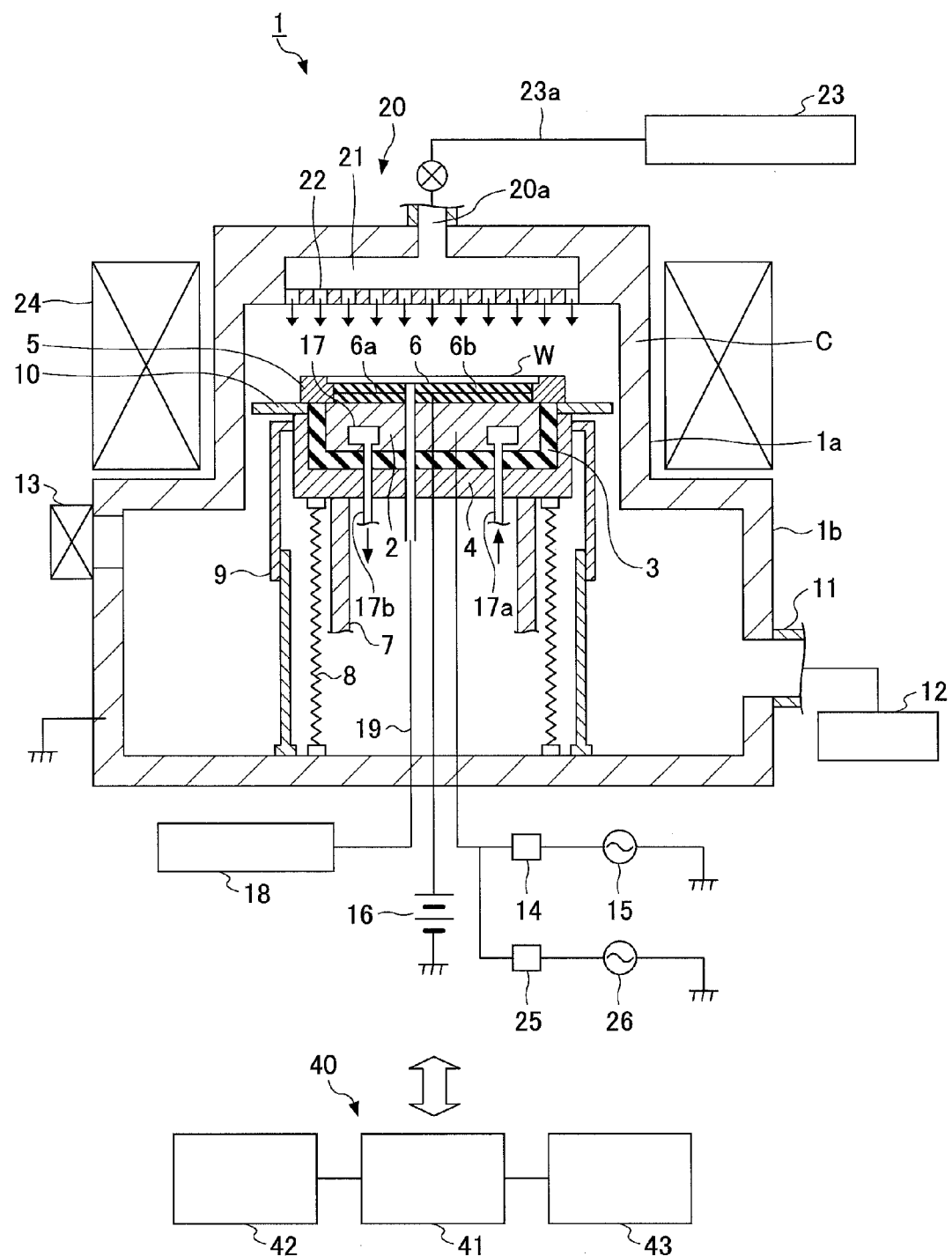
FIG. 1 is a view illustrating the overall structure of a plasma etching apparatus of an embodiment.

The invention will be described herein with reference to illustrative embodiments. It is to be noted that, in the explanation of the drawings, the same components are given the same reference numerals, and explanations are not repeated.

[Entire Structure of Plasma Etching Apparatus]

Figure 2:
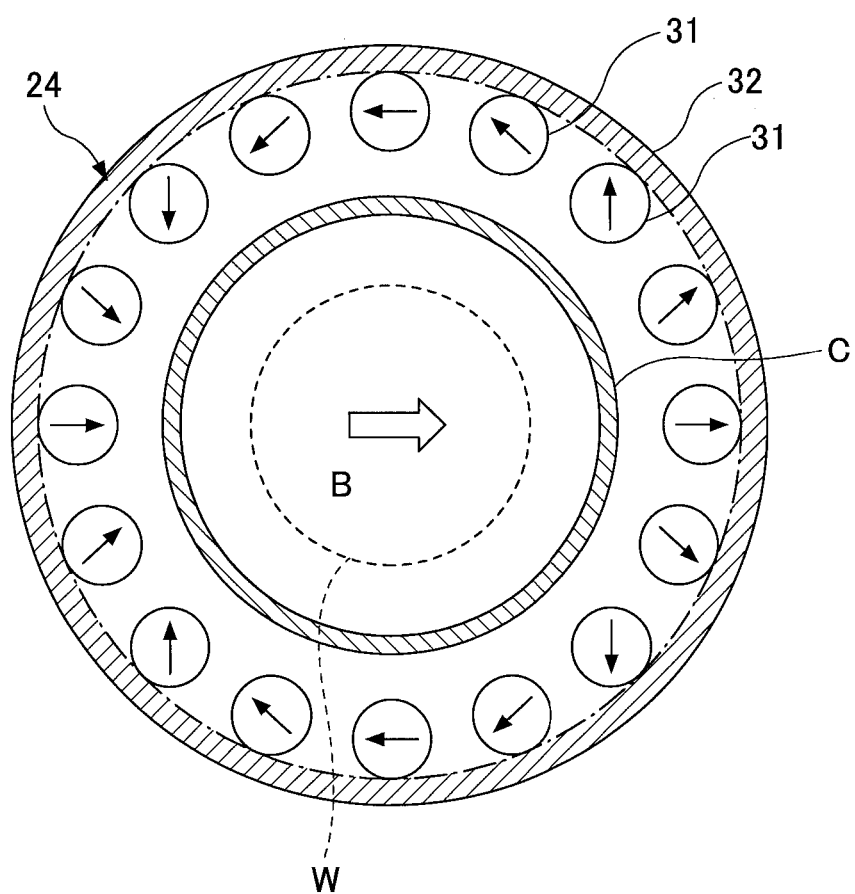
FIG. 2 is a lateral cross-sectional view illustrating a dipole ring magnet illustrated in FIG. 1.

First, a structure of a plasma etching apparatus that performs a method of forming a pattern of an embodiment is explained with reference to FIG. 1 and FIG. 2. FIG. 1 is a vertical cross-sectional view illustrating the overall structure of a plasma etching apparatus of the embodiment. FIG. 2 is a lateral cross-sectional view of a dipole ring magnet illustrated in FIG. 1.

In the plasma etching apparatus of the embodiment, first, an etching step in which a substrate to be processed (a silicon wafer, for example (hereinafter, simply referred to as a "wafer")) is etched by plasma via a mask having a predetermined pattern at a back surface side of a silicon layer of the wafer is performed. After the etching step, a cleaning step is performed in which the wafer is cleaned by plasma using cleaning gas obtained by mixing CF series gas and inert-gas.

A plasma etching apparatus 1 of the embodiment is configured as a plasma etching apparatus of a magnetron Reactive Ion Etching (RIE), and includes a chamber C made of metal such as aluminium, stainless steel or the like, for example.

In the chamber C, a susceptor 2 for mounting the wafer W, for example, is provided. The susceptor 2 is made of aluminium, for example, and is supported by a support portion 4 made of a conductive material via an insulating member 3. A focus ring 5 made of quartz, for example, is provided at a periphery of an upper surface of the susceptor 2. An electrostatic chuck 6 is provided at the upper surface of the susceptor 2 for supporting the wafer W by an electrostatic attraction. The susceptor 2 and the support portion 4 are movable in upper and lower directions by an elevating mechanism including a ball screw 7 and an elevating drive unit (not illustrated in the drawings), provided below the support portion 4, is covered by a bellows 8 made of stainless steel. A bellows cover 9 is provided outside the bellows 8. A lower surface of the focus ring 5 is connected to a baffle plate 10, and the focus ring 5 is electrically connected to the chamber C via the baffle plate 10, the support portion 4 and the bellows 8. The chamber C is grounded.

The chamber C includes an upper portion 1a and a lower portion 1b having a larger diameter than that of the upper portion 1a. The chamber C is provided with an air exhaust 11 at a side wall of the lower portion 1b of the chamber C and an evacuation device 12 is connected to the air exhaust 11 via an exhaust pipe. A process space in the chamber C is decompressed to a predetermined pressure by operating a vacuum pump of the evacuation device 12. The chamber C is provided with a gate valve 13 at a side wall of the lower portion 1b for opening and closing a transferring port of the wafer W.

A first high frequency power source 15 for plasma generation and Reactive Ion Etching (RIE) is electrically connected to the susceptor 2 via a matching unit 14. The first high frequency power source 15 supplies a high frequency electric power with a frequency of 100 MHz, for example, as a high frequency electric power for plasma generation to a lower electrode, in other words, the susceptor 2.

Further, a second high frequency power source 26 is electrically connected to the susceptor 2 via a matching unit 25. The second high frequency power source 26 supplies a high frequency electric power with a frequency of 400 kHz, for example, as a high frequency electric power for bias to the susceptor 2 in a superimposed manner.

A shower head 20, which will be explained later, is provided at a ceiling portion of the chamber C as a grounded upper electrode. Thus, the first high frequency electric power from the first high frequency power source 15 is supplied between the susceptor 2 and the shower head 20.

The electrostatic chuck 6 includes a pair of insulating sheets 6b and an electrode 6a made of a conductive film and interposed between the pair of insulating sheets 6b. A direct current power source 16 is electrically connected to the electrode 6a. The wafer W is attracted to the electrostatic chuck 6 by the electrostatic attraction generated by direct-current voltage from the direct current power source 16.

A coolant room 17 that extends in a circumferential direction is provided inside the susceptor 2, for example. Coolant such as cooling water, at a predetermined temperature, is provided, in a circulatory manner, to the coolant room 17 from an external chiller unit (not illustrated in the drawings) via pipes 17a and 17b. The wafer W provided on the susceptor 2 is controlled to be a predetermined process temperature by the temperature of the circulated coolant.

Further, a cooling gas such as He gas, for example, from a gas introduction mechanism 18 is supplied between an upper surface of the electrostatic chuck 6 and a back surface of the wafer W via a gas supply line 19. The gas introduction mechanism 18 is configured such that the gas pressures, in other words, back pressures, at the center portion of the wafer and the peripheral portion of the wafer are independently controlled in order to increase across-the-wafer uniformity in an etching process.

The shower head 20 provided at the ceiling portion of the chamber C is provided with a plurality of gas discharging ports 22 at a lower surface that horizontally faces an upper surface of the susceptor 2. A buffer room 21 is provided inside a gas discharging surface. A gas supply source 23 is connected to a gas introduction port 20a of the buffer room 21 via a gas supply pipe 23a. A process gas is supplied from the gas supply source 23.

The dipole ring magnet 24 that circularly or concentrically extends is provided at a periphery of the upper portion 1a of the chamber C. As illustrated in FIG. 2, which is a lateral cross-sectional view, the dipole ring magnet 24 includes a ring-shaped magnetic casing 32 and a plurality, for example, 16, of anisotropy segment columnar magnets 31 aligned along a circumferential direction with a predetermined space. In FIG. 2, arrows illustrated in the anisotropy segment columnar magnets 31 express directions of magnetization directions, respectively. By gradually shifting the magnetization directions of the anisotropy segment columnar magnets 31 as illustrated in FIG. 2, a horizontal magnetic field B directing to a single direction can be generated in total.

Thus, an RF electric field in a vertical direction is generated due to the high frequency electric power by the first high frequency power source 15 and a magnetic field in a horizontal direction is generated by the dipole ring magnet 24, in a space between the susceptor 2 and the shower head 20. High density plasma is generated in the vicinity of the surface of the susceptor 2 by a magnetron discharge using the orthogonal electromagnetic field.

The entirety of the plasma etching apparatus is controlled by a control unit 40. The control unit 40 includes a Central Processing Unit (CPU) 41, a Read Only Memory (ROM) 42 and a Random Access Memory (RAM) 43. The CPU 41 executes a plasma process in accordance with various recipients stored in these memory areas. In each of the recipients, control information for the apparatus in accordance with process conditions such as process period, temperature in a process room (temperature of the upper electrode, sidewall temperature of the process room, ESC temperature or the like), pressure (evacuation of gasses), high frequency electric power or voltage, flow rates of various process gasses, flow rates of heat-transferring gasses or the like are described.

The functions of the control unit 40 may be actualized by operating using software or operating using hardware.

In the plasma etching apparatus configured as described above, for performing plasma etching, first, the gate valve 13 is opened, and the wafer W is introduced into the chamber C to be mounted on the susceptor 2. Then, the susceptor 2 on which the wafer W is mounted is elevated to a position as illustrated and the chamber C is evacuated by the vacuum pump of the evacuation device 12 via the air exhaust 11. Then, process gas is introduced into the chamber C at a predetermined flow rate from the gas supply source 23 to set the pressure in the chamber C to be a predetermined set value. Further, high frequency electric power with a predetermined electric power from the first high frequency power source 15 is applied to the susceptor 2. Further, direct voltage from the direct current power source 16 is applied to the electrode 6a of the electrostatic chuck 6 to fix the wafer W to the susceptor 2. The process gas introduced from the shower head 20 is ionized or dissociated by magnetron discharge to generate plasma. Then, the wafer W is etched by radical or ion included in the generated plasma.

The entire structure of the plasma etching apparatus 1 of the embodiment is explained above. In the method of forming a pattern of the embodiment as will be explained in the following, an element isolation layer is formed by etching a silicon layer of a wafer W to a predetermined pattern using the above described plasma etching apparatus 1 of the embodiment. Further, an etching surface of the element isolation layer is cleaned using a desired cleaning gas using the plasma etching apparatus 1 after the etching step.

[Element Isolation of CMOS Image Sensor]

Figure 3:
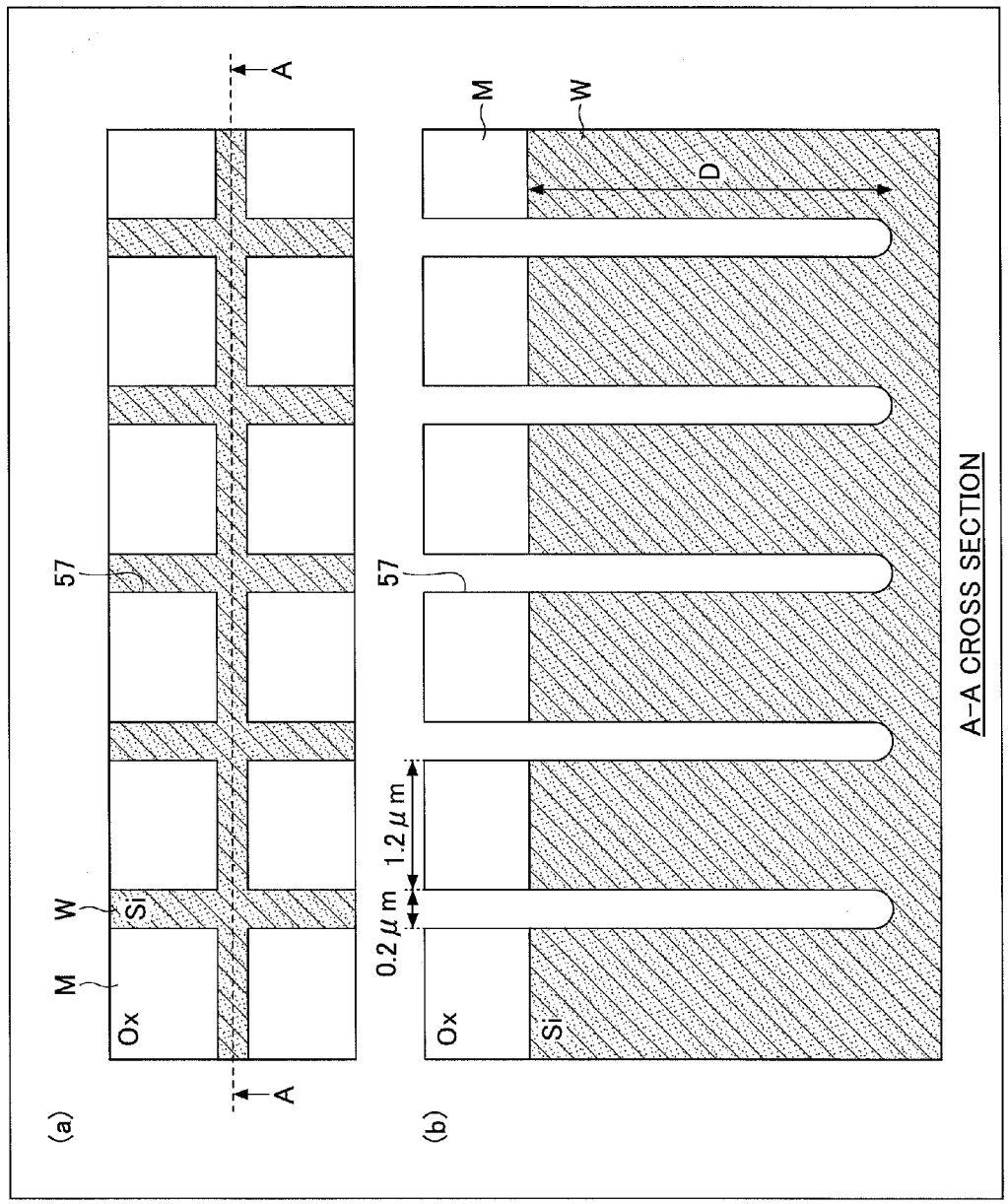
FIG. 3 is a view illustrating an element isolation structure of a solid-state image sensor device of the embodiment.

In FIG. 3, (a) and (b) illustrate an element isolation structure of the embodiment that is formed in the silicon layer of the wafer W. In FIG. 3, (b) is an A-A cross-sectional view of (a). In this embodiment, the wafer W is etched that has a structure obtained by reversing the wafer W in upward and downward directions and bonding a front surface of the wafer W with a support substrate.

Figure 4A:
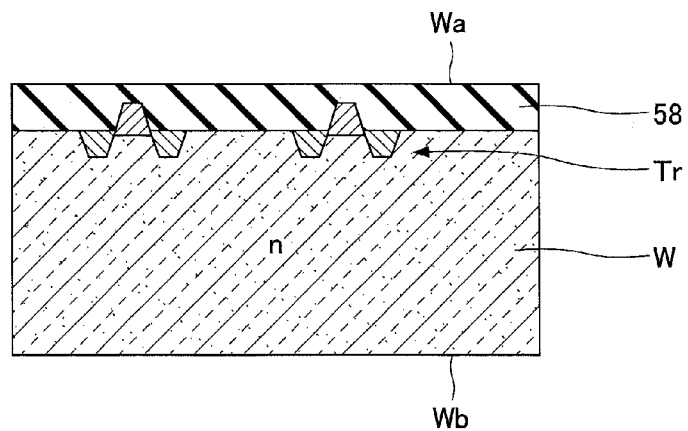
FIG. 4A to FIG. 4C are cross-sectional views illustrating manufacturing steps of the solid-state image sensor device of the embodiment.
Figure 4B:
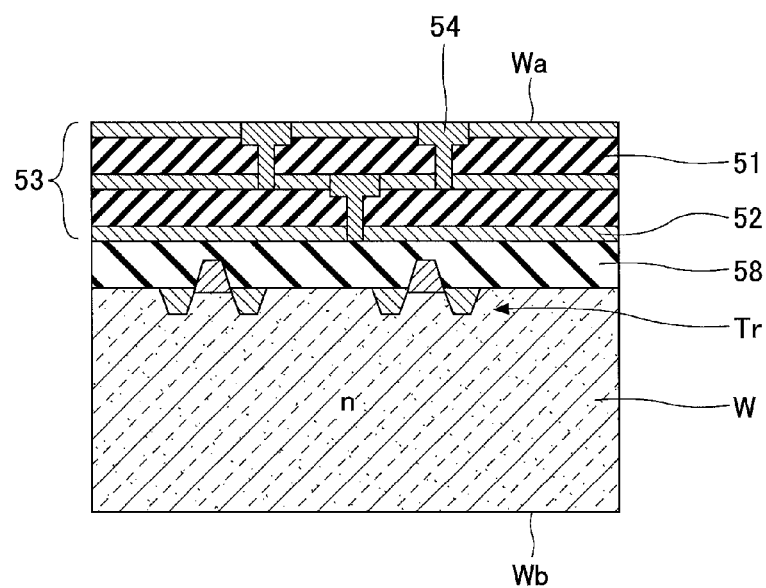
Figure 4C:
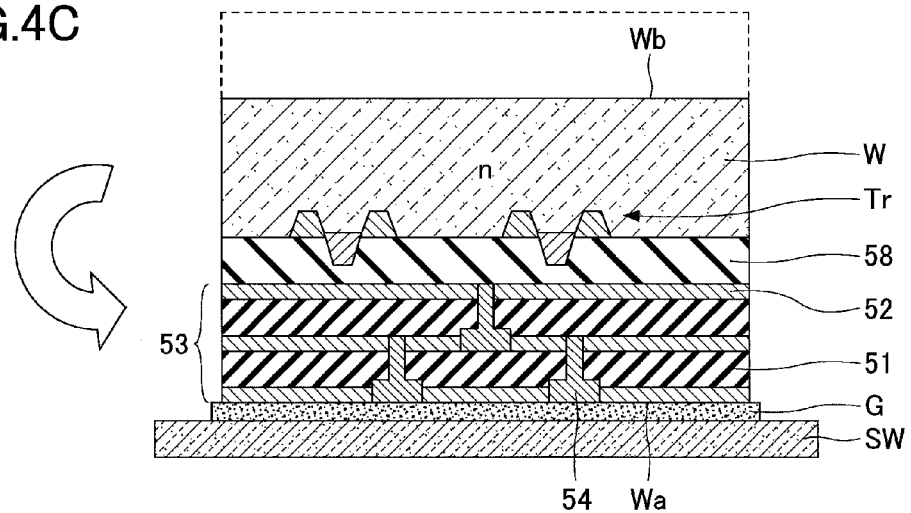

As illustrated in FIG. 4A to FIG. 4C, for example, the bonded wafer has a structure obtained by reversing the wafer W in upward and downward directions and bonding a front surface Wa of the wafer W to a support wafer SW by an adhesive agent G. The wafer W is an example of a substrate to be processed at the front surface Wa of which semiconductor devices such as transistors or the like are formed. The support wafer SW is an example of a support substrate that strengthens the thinned wafer W, when a back surface Wb of the wafer W is grinded to be thinner.

By coating a resist on the back surface Wb of the thus structured bonded wafer W, exposing and developing, a grid-like resist pattern as illustrated in (a) of FIG. 3 is formed. Then, an etching step of the embodiment, which will be explained later, is performed to etch the silicon layer of the wafer W using the resist as an etching mask M so that a grid-like element isolation region 57 is formed. With this, a CMOS image sensor (corresponding to a solid-state image sensor device), which will be explained next, in which the unit pixels are isolated and a plurality of the unit pixels are two-dimensionally arranged. Here, the mask M used in etching may be a polysilicon mask or a resist mask.

Figure 5A:
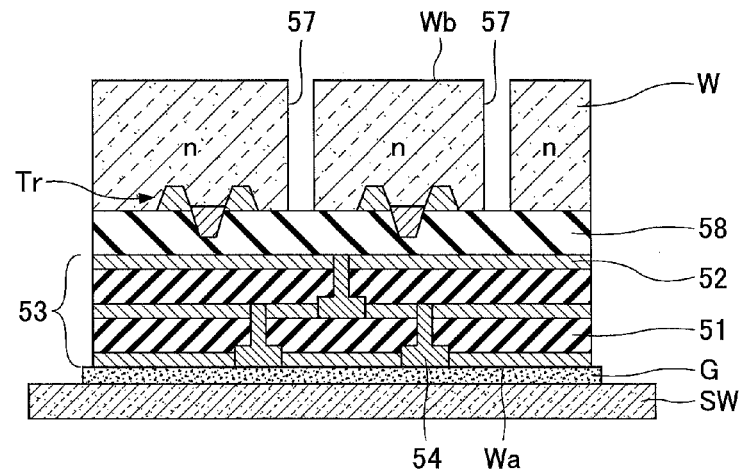
FIG. 5A to FIG. 5C are cross-sectional views (subsequent to FIG. 4A to FIG. 4C) illustrating manufacturing steps of the solid-state image sensor device of the embodiment.
Figure 5B:
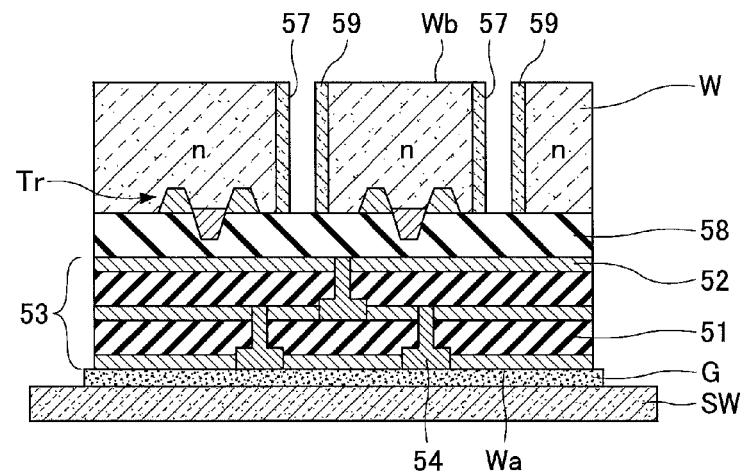
Figure 5C:
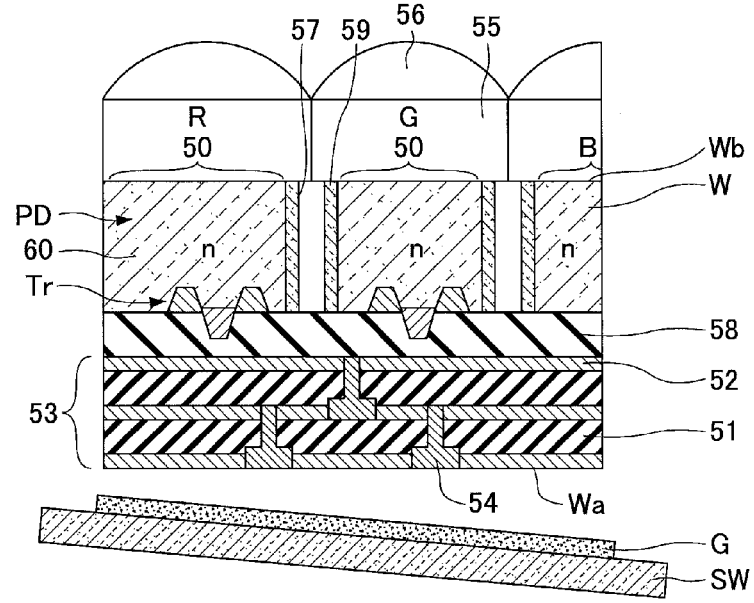

In this embodiment, when manufacturing the CMOS image sensor, as illustrated in FIG. 5A to FIG. 5C, unit pixels 50, each composed of a photodiode PD that functions as a light receiving unit and a plurality of pixel transistors Tr, are formed on the wafer W. In this embodiment, the element isolation region 57 is formed by etching the wafer W of the bonded structure obtained by reversing the wafer W on which the unit pixels 50 and the wiring structure 53 are thus formed in the upward and downward directions, and bonding the front surface Wa of the wafer W to the support substrate SW.

[Manufacturing of CMOS Image Sensor]

Next, a method of manufacturing the CMOS image sensor is explained with reference to FIG. 4A to FIG. 4C and FIG. 5A to FIG. 5C. In the method of manufacturing the CMOS image sensor, to which the method of forming a pattern of the embodiment is applied, first, as illustrated in FIG. 4A, the transistors Tr are formed on the front surface Wa of the wafer W, which is a silicon wafer or the like, and then an interlayer insulating film 58 is formed on the wafer W on which the transistors Tr are formed.

Then, as illustrated in FIG. 4B, the wiring structure 53 is formed on the interlayer insulating film 58. The wiring structure 53 includes a stacked structure of wiring layers 52 and insulating films 51 that are alternately stacked on the interlayer insulating film 58 and is provided with vias 54 that penetrate the insulating film 51 to electrically connect the wiring layers 52 provided above and below the respective wiring layer 52.

Next, as illustrated in FIG. 4C, the wafer W is reversed, the front surface Wa side of the wafer W is bonded to the support substrate SW by the adhesive agent G and the back surface Wb of the wafer W is grinded to be thinner.

Thereafter, the silicon layer of the wafer W is etched by plasma via a grid-like patterned mask as illustrated in (a) of FIG. 3 to form the element isolation region 57 as illustrated in (b) of FIG. 3 and FIG. 5A. The depth "D" of the element isolation region 57 is about 4.0 μm.

Next, as illustrated in FIG. 5B, boron is introduced into the element isolation region 57 by implantation (ion implantation) to form a p-type semiconductor layer 59, which has a conductivity type opposite to an n-type electric charge accumulation region 60 of the photodiode PD illustrated in FIG. 5C.

Next, as illustrated in FIG. 5C, the support wafer W is removed from the wafer W. The CMOS image sensor manufactured by the method of forming the pattern of the embodiment includes a pixel region in which the unit pixels 50 are regularly two-dimensionally arranged on the thinned wafer W. Each of the unit pixels 50 is composed of the photodiode PD, which functions as the photoelectric conversion unit, and the plurality of pixel transistors Tr. The photodiode PD includes the n-type electric charge accumulation region 60 that has functions of photoelectric conversion and electric charge accumulation along the entire region in the thickness direction of the wafer W. For the unit pixels, a so-called shared pixel structure in which a plurality of photoelectric conversion units share the pixel transistors (except transfer transistors) may be used. The plurality of pixel transistors Tr may be composed of 4 transistors including a transfer transistor, a reset transistor, an amplifying transistor and a selection transistor, or 3 transistors omitting the selection transistor. The transfer transistor forms a transfer gate electrode where the photodiode PD functions as a source.

The back surface Wb of the wafer W, which is opposite to the front surface Wa where the wiring structure 53 is formed becomes a light receiving surface and an insulating film such as an antireflection film (not illustrated in the drawings) or the like, a shading film (not illustrated in the drawings) or the like for preventing injection of incident light to adjacent pixels are formed on the back surface Wb. Further, a color filter 55 and an on-chip lens 56 are formed. The light is irradiated on the photodiodes PD from the back surface Wb side of the wafer W via the on-chip lens 56.

[Residual Product in Etching Step]

When forming the element isolation region 57, the silicon layer of the wafer W is etched at a high speed. At this time, an etching process in which sulfur hexafluoride gas ($SF_6$) is mainly used is performed. As a result, as illustrated in (a) of FIG. 6, a residual product R is formed at a sidewall of silicon after the etching process.

There may be a case where an interface state is generated, due to the residual product R at the etching surface, to cause a generation of a white point. Generation of the white point decreases electrical characteristics of image sensors of the CMOS image sensor. In particular, there is a possibility that an electrical noise is generated in the image sensors of the CMOS image sensor by a fluorine (F) component included in the residual product R. Thus, it is important to remove the residual product R which is SiO—F (SiFx) at a surface of silicon by performing a cleaning step after the etching step.

However, if wet cleaning including washing by chemical solution is formed in a state where the element isolation region 57 is formed after the etching process as illustrated in FIG. 5A, the adhesive agent G between the wafer W and the support substrate SW is dissolved. Thus, wet etching cannot be used for the structure in which the front surface Wa of the wafer W is bonded to the support substrate SW.

On the other hand, a cleaning method may be considered in which the fluorine (F) component included in the residual product is vaporized by heat treatment. However, in the above described bonded structure, the transistors Tr and the wiring structure 53 are formed at the front surface Wa side of the wafer W. Thus, if cleaning by heat treatment is performed in a state where the element isolation region 57 is formed as illustrated in FIG. 5A, the formed transistors Tr and the wiring structure 53 are damaged by heat during cleaning. Thus, cleaning by heat treatment cannot be used for the above described bonded structure.

Therefore, according to the method of forming the pattern of the embodiment, cleaning (treatment) by dry etching using plasma is performed at a state where the element isolation region 57 is formed after the etching process as illustrated in FIG. 5A. With this, the residual product including the fluorine (F) component adhered to a silicon surface of the element isolation region 57 can be removed after the etching process. As a result, decreasing of the electrical characteristics of the pixels of the CMOS image sensor can be prevented. In the following, the cleaning step that is performed using the plasma etching apparatus 1 as illustrated in FIG. 1 after the etching step is explained.

[Cleaning Step]

Here, the cleaning step of the method of forming the pattern of the embodiment is explained by an example of manufacturing the CMOS image sensor by a method of forming a pattern on the silicon layer from the back surface Wb side of the wafer W, which is supported by the support substrate SW at the back surface Wb side and on which the plurality of unit pixels 50 and the wiring structure 53 are formed at the front surface Wa side. However, devices formed by the method of forming the pattern of the embodiment are not limited to the CMOS image sensor. For example, the method can be applied to any devices that are manufactured by a method of forming a pattern on the silicon layer from the back surface Wb side of the wafer W, where a semiconductor device is formed at the front surface Wa side of the wafer W and the wafer W is supported by the support substrate at the front surface Wa side.

In the method of forming the pattern of the embodiment, as illustrated in (a) of FIG. 6, the residual product R of a silicon oxide film including fluorine F ($SiO_2(F)$) is formed at the sidewall of silicon after the etching process.

As illustrated in (b) of FIG. 6, in order to remove the residual product R, cleaning gas obtained by mixing methane tetrafluoride gas ($CF_4$) and argon gas (Ar) is introduced after the etching step (start of the cleaning step). Here, the cleaning gas is not limited to the mix of methane tetrafluoride gas ($CF_4$) and argon gas (Ar) as long as it is a mix of CF series gas and inert-gas. For example, the CF series gas may be any gas capable of etching the silicon layer but has a low reactivity with silicon. The inert-gas may be gas for isotropically etching the residual product. As an example, hydrogen gas ($H_2$) or xenon gas (Xe) may be used.

Methane tetrafluoride gas ($CF_4$) in the cleaning gas reacts with silicon oxide including fluorine $SiO_2(F)$ composing the residual product R to be ejected as silicontetrafluoride gas ($SiF_4$), carbon dioxide gas ($CO_2$), carbon monoxide gas (CO), oxygen gas ($O_2$) and fluorine gas (F), as illustrated in (c) of FIG. 6. As such, the residual product R deposited in the etching step is removed. Here, a part of methane tetrafluoride gas ($CF_4$) reacts with silicon (Si) and is ejected as silicontetrafluoride gas ($SiF_4$) and carbon gas (C).

[Experimental Result: Cleaning Step]

Figure 7:
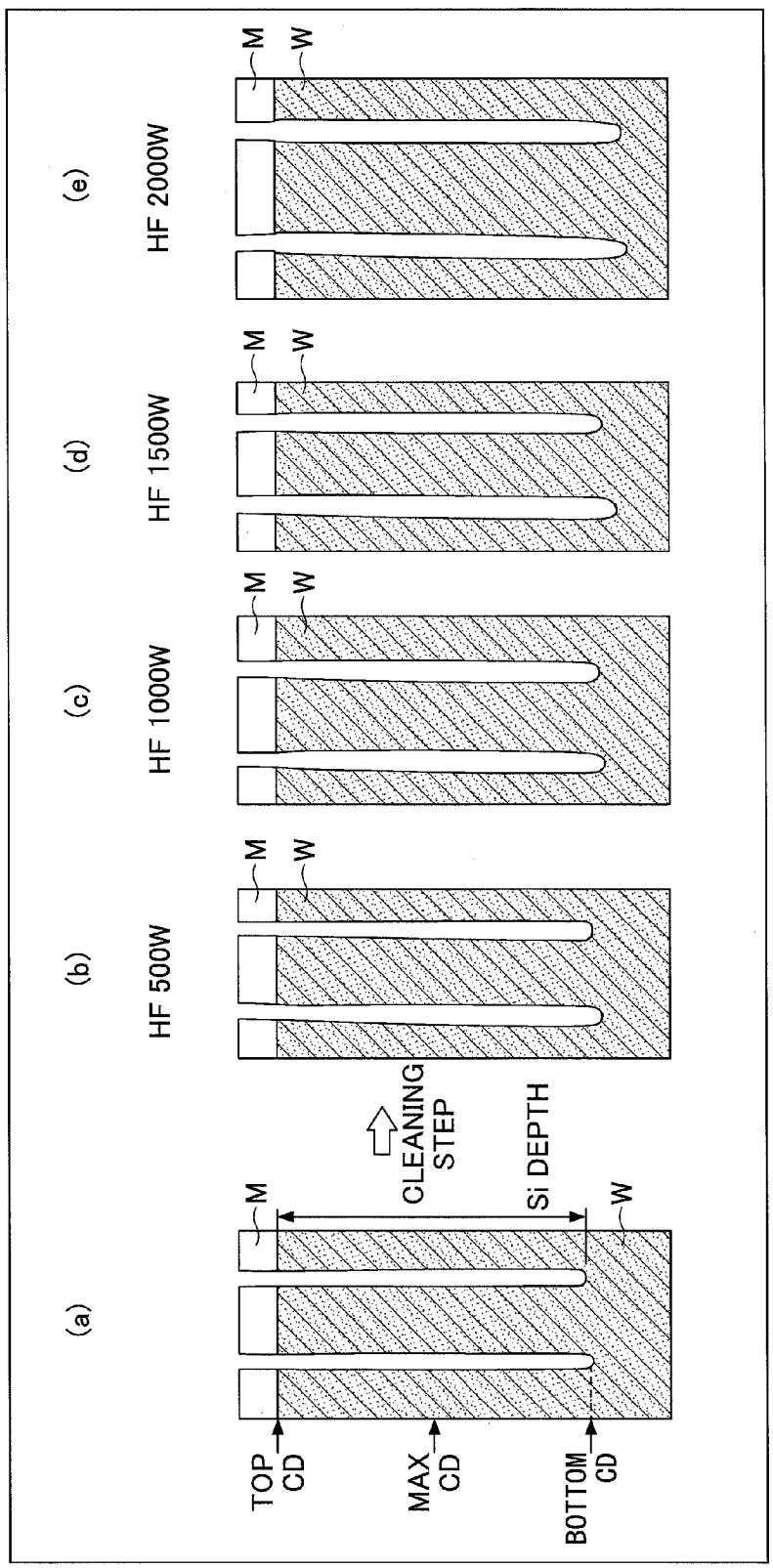
FIG. 7 is a view illustrating the dependency of the kind of gas and high frequency in the cleaning step of the embodiment.

Next, statuses of the element isolation region before and after the cleaning step of the embodiment when the cleaning gas is a mix of methane tetrafluoride gas ($CF_4$) and argon gas (Ar), are explained with reference to FIG. 7 to FIG. 9B. FIG. 7 is a view illustrating statuses of the element isolation region before and after the cleaning step when a high frequency for plasma generation HF is varied in the cleaning step of the embodiment. FIG. 8 is a view illustrating CD values of the element isolation regions formed at the center portion and the edge portion of the wafer W before and after the cleaning step illustrated in FIG. 7. FIG. 9A and FIG. 9B are graphs illustrating difference in the CD values before and after the cleaning step illustrated in FIG. 8.

In this embodiment, as illustrated in (a) of FIG. 7, the CD (Critical Dimension) value of the uppermost portion of the element isolation region of the silicon layer formed in the wafer W is referred to as a "top CD", the CD value of the bottom portion of the element isolation region is referred to as a "bottom CD" and a portion having a maximum CD value in a middle region between the top CD and the bottom CD is referred to as a "max CD".

Process conditions in the cleaning step at this time are described in the following. Here, a wafer whose size (diameter) is 300 mm was used.

<Cleaning Step: Process Conditions>

Frequency of high frequency for plasma generation HF: 100 MHz

Electric power of high frequency for plasma generation HF: varied (500 to 2000 W: Electric power per unit area was 0.71 W/cm$^2$ to 2.83 W/cm$^2$)

High frequency for bias LF: not applied

Kind of gas and gas flow ratio: $CF_4$ gas/Ar gas ≈2:3

Cleaning process time: 1 minute

As a result of the experiment, it can be visually confirmed that the CD values of the element isolation region after the cleaning step as illustrated in (b) to (e) of FIG. 7 become larger than the CD value after the etching step but before the cleaning step as illustrated in (a) of FIG. 7. Further, in the cleaning step, by comparing the electric power of the high frequency for plasma generation HF, 500 W (0.71 W/cm$^2$) of (b) of FIG. 7, 1000 W (1.42 W/cm$^2$) of (c) of FIG. 7, 1500 W (2.12 W/cm$^2$) of (d) of FIG. 7 and 2000 W (2.83 W/cm$^2$) of (e) of FIG. 7, it can be visually confirmed that the larger the electric power of the high frequency for plasma generation HF becomes, the larger the CD value after the cleaning step becomes.

FIG. 8 illustrates tables in which etching depth, top CD, max CD and bottom CD of silicon of the element isolation regions at the center portion and the edge portion of the wafer W before and after the cleaning step as illustrated in (a) to (e) of FIG. 7. FIG. 9A and FIG. 9B are graphs illustrating the difference in CD values of the top CD, the max CD and the bottom CD before and after the cleaning as illustrated in FIG. 8. Horizontal axes of FIG. 9A and FIG. 9B are electric power of the high frequency for plasma generation (HF power: W (unit)) and vertical axes of FIG. 9A and FIG. 9B are difference in CD before and after the cleaning step when the respective electric power is applied (CDΔ: nm (unit)). Specifically, line T indicates difference (CDΔ) in the top CD before and after the cleaning step, line M indicates difference (CDΔ) in the max CD before and after the cleaning step, and line B indicates difference (CDΔ) in the bottom CD before and after the cleaning step.

With this, it can be understood that the amount of the residual product R etched within a minute becomes larger as the electric power of the high frequency for plasma generation HF becomes larger at both the center portion and the edge portion. This is because energy when ions are impacted increases as the electric power of the high frequency for plasma generation HF increases. Further, for all of the CDΔ at the top CD, the max CD and the bottom CD, the amount of the residual product R etched within a minute increases as the electric power of the high frequency for plasma generation HF increases, and the variance in the etched amount has the same tendency.

Further, by the CDΔ of the top CD, the max CD and the bottom CD, it can be understood that the residual product R at the bottom CD is etched most.

Further, when the electric power of the high frequency for plasma generation HF is set to be 500 W, for all of the CDΔ at the top CD, the max CD and the bottom CD, the residual product R is etched within a range of 30 to 60 nm by the cleaning for a minute and it is expected that damage to the silicon layer is very small. On the other hand, when the electric power of the high frequency for plasma generation HF is set to be 2000 W, for all of the CDΔ at the top CD, the max CD and the bottom CD, more than or equal to 60 nm of the residual product R is etched by the cleaning for a minute, and it is expected that more damage is caused to the silicon layer compared with the case when the electric power of the high frequency for plasma generation HF is set to be 500 W. Thus, it is preferable to clean the wafer W by plasma while applying the high frequency for plasma generation of 500 W to 1500 W (electric power per unit area: 0.71 W/cm$^2$ to 2.12 W/cm$^2$) according to the cleaning step of the embodiment. Here, the reason that the cleaning gas obtained by mixing methane tetrafluoride gas (CF$_4$) and argon gas (Ar) is used in this embodiment is as follows. As methane tetrafluoride gas (CF$_4$) has a low reactivity with silicon so that the amount the silicon is impacted is small and it is possible to reduce fluoride (F) at the etching surface while reducing damage to silicon.

(Secondary Ion Mass Spectrometry)

Next, composition of the residual product at the etching surface was confirmed by secondary ion mass spectrometry. Secondary ion mass spectrometry is a method of analyzing a chemical structure of the etching surface by analyzing secondary ions generated from the etching surface (topmost surface) by irradiation of ion pulse by a Time-of-Flight mass spectrometer. The result is illustrated in FIG. 10.

Figure 10:
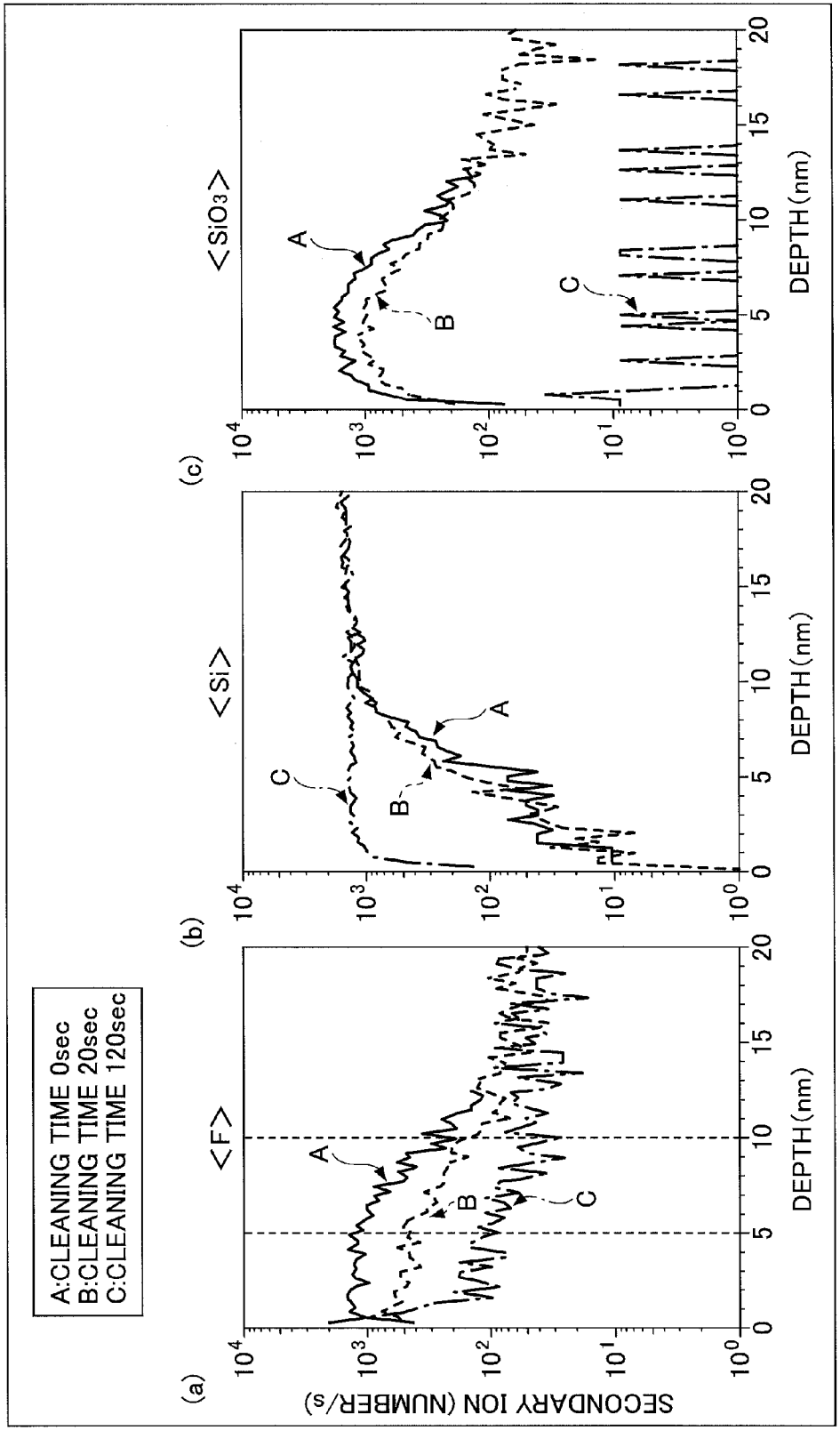
FIG. 10 illustrates graphs indicating the number of secondary ions at the cleaning time and depth direction of the substrate to be processed, according to the embodiment.

In FIG. 10, horizontal axis indicates depth (nm) from the etching surface and vertical axis indicates the number of secondary ions generated per second (number/s) by irradiation of ion pulse at the respective depth. In FIG. 10, (a) indicates the number of secondary ions (number/s) of an F component, (b) indicates the number of secondary ions (number/s) of a Si component and (c) indicates the number of secondary ions (number/s) of a SiO$_3$ component. Here, the cleaning process time was varied. Specifically, in each of the graphs, "A" indicates a case without cleaning (cleaning time is 0 second), "B" indicates a case when the cleaning time is 20 seconds and "C" indicates a case when the cleaning time is 120 seconds.

By referring to "A" in (a) and (c) of FIG. 10, it can be understood that the F component exists at a depth of about 10 nm or 15 nm from the sidewall surface of the etching surface with the SiO component after the etching step.

When the cleaning step is performed for 20 seconds, the concentration of fluorine F at a depth of 5 nm from the etching surface is about half of that at the etching surface (depth of 0 nm) of "A", which is the case without cleaning. Generation of secondary ion is considered as the same level (same as a normal value) as a background, at which the residual product hardly exists, when it is at a level about 10$^2$ number/s. By referring to "B" in (a) of FIG. 10, by performing the cleaning step for 20 seconds, the concentration of fluorine F at the depth of 10 nm from the etching surface becomes the same level (same as a normal value) as the background, at which the residual product hardly exists.

In this embodiment, by performing the cleaning step for 20 seconds, the residual product at the etching surface can be etched about 10 nm for one side of the sidewall. This means that a removed amount (etching amount) of the sidewall of the etching surface by the cleaning is about 10 nm when the cleaning step is performed for 20 seconds.

Further, by referring to "C" in (a) of FIG. 10, by performing the cleaning step for 120 seconds, the concentration of fluorine F at a depth of 2 nm to 3 nm from the etching surface can be reduced to the same level as a normal value at which the deposited object of SiFx does not exists. It means that a removed amount (etching amount) of the sidewall of the etching surface by the cleaning is about 80 nm when the cleaning step is performed for 120 seconds.

However, by referring to (b) of FIG. 10, for silicon (wafer W) under the residual product, silicon contents are almost the same regardless of the cleaning time, when the residual product at the etching surface is removed about 10 nm for one side of the sidewall. This means that when the residual product at the etching surface is etched about 10 nm for one side of the sidewall, it is expected that almost the entire residual product is removed and the silicon layer is exposed.

Thus, the process time of the cleaning step may be determined such that the residual product deposited on the sidewall of a pattern formed in the silicon layer in the etching step is etched for 5 nm to 10 nm for one side of the sidewall. The process time of the cleaning step may be set based on the number of fluorine F of the secondary ions from the wafer W measured by the secondary ion mass spectrometry after the cleaning. With this, the concentration of the fluorine F component of the residual product can be reduced to a half to a concentration at a state that the fluorine residual product hardly exists without causing excessive damage to the silicon layer.

By actually performing the cleaning step of the embodiment to etch the sidewall for 10 nm for one side and 20 nm for both sides from the etching surface, light emission by the secondary ion mass spectrometry was hardly observed. This means that the secondary ions are hardly generated from the etching surface even irradiating ion pulse. Thus, by controlling the process time of the cleaning step to etch the etching surface to a level that an F remaining amount becomes about a level of 10$^2$ number/s, there is almost no possibility that an electrical noise is generated due to the fluorine (F) component.

[Selection of Gas]

In this embodiment, a mix of methane tetrafluoride gas ($CF_4$) and argon gas (Ar) was used as the cleaning gas in the cleaning step.

Here, three gas pattern types, a single argon gas (Ar), a single hydrogen bromide gas (HBr), and a mix of methane tetrafluoride gas ($CF_4$) and argon gas (Ar), are selected as the cleaning gas. Then, the cleaning step of the embodiment after the etching step is performed to optimize selection of gas.

Figure 11:
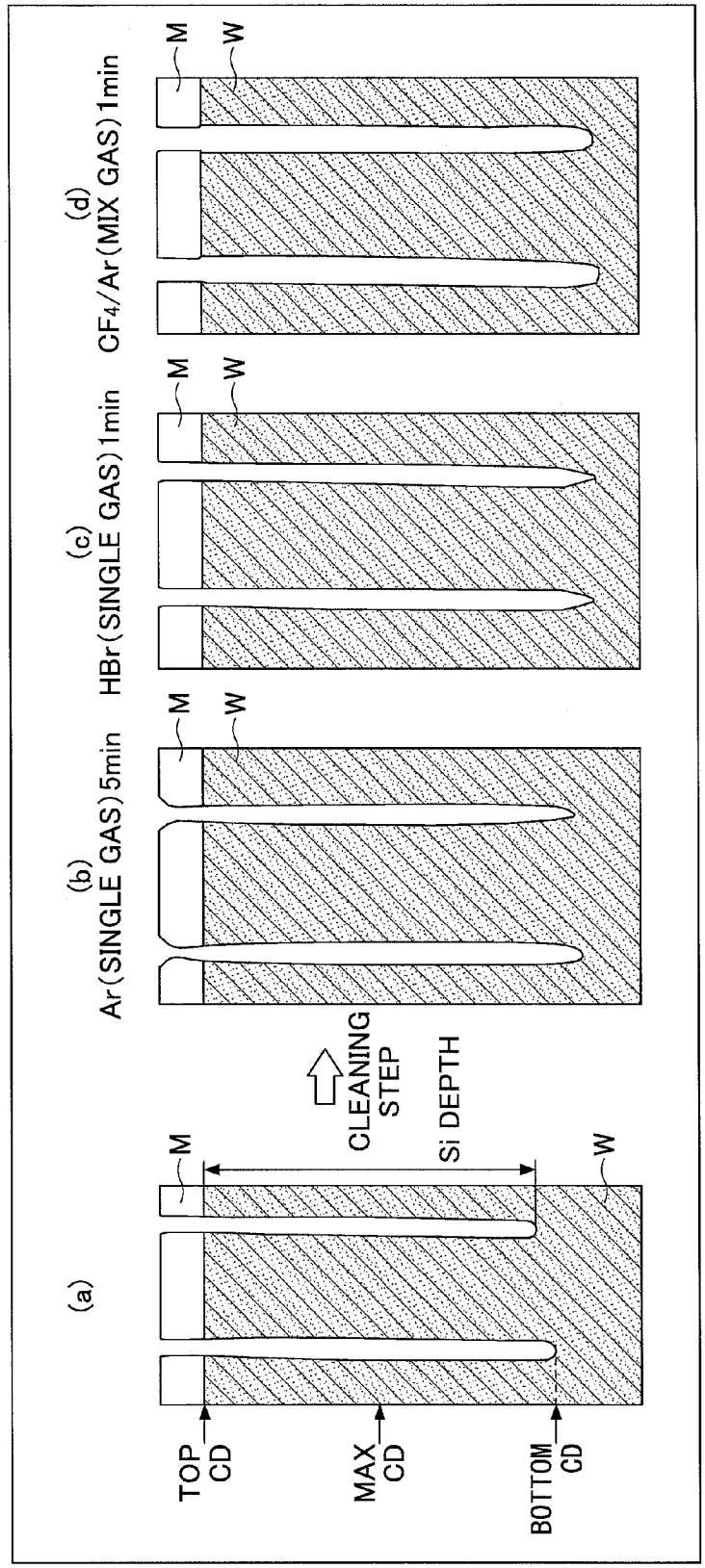
FIG. 11 illustrates views indicating dependency of kind of gas in the cleaning step of the embodiment.

FIG. 11 illustrates views indicating statuses of the element isolation region before and after the cleaning step when the above described three patterns of cleaning gases are used in the cleaning step of the embodiment. In FIG. 11, (a) indicates a status of the element isolation region after the etching step, and (b) to (d) indicate statuses of the element isolation region after the cleaning step. Process conditions at this time are described in the following. Here, a wafer whose size (diameter) is 300 mm was used.

Figure 13:
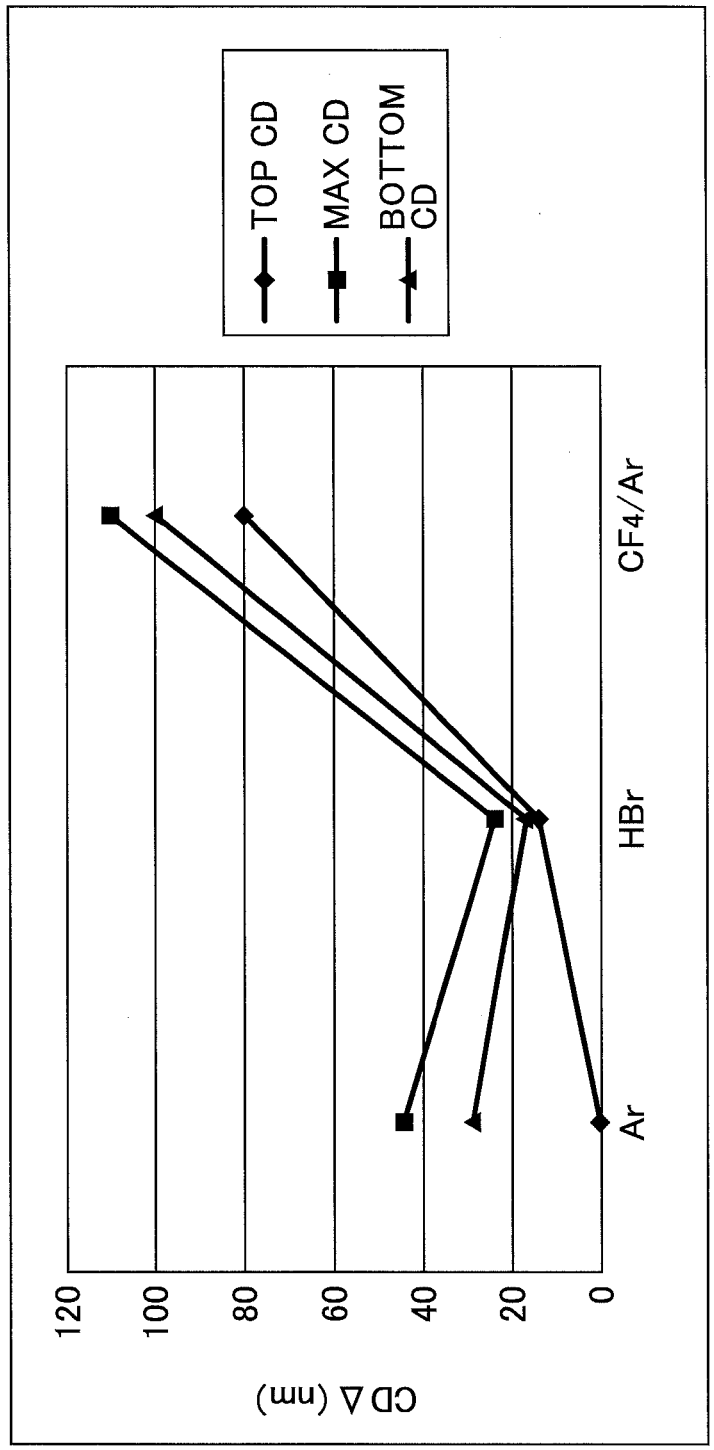
FIG. 13 is a graph indicating dependency on kind of gas of CD value (difference) before and after the cleaning step illustrated in FIG. 11.

<Process Conditions>
Frequency of high frequency for plasma generation HF: 100 MHz
Electric power of high frequency for plasma generation HF: 2000 W (Electric power per unit area was 2.83 $W/cm^2$)
High frequency for bias LF: not applied
Kind of gas and gas flow ratio: 3 patterns (a single Ar gas, a single HBr gas, a mix of $CF_4$/Ar)
Cleaning process time: 5 minutes for single Ar gas
 : 1 minute for single HBr gas
 : 1 minute for mix of $CF_4$/Ar FIG. 12 illustrates CD values of the element isolation region at the center portion and the edge portion of the wafer W before and after the cleaning step as illustrated in FIG. 11. FIG. 13 is a graph illustrating the difference in CD values (CDΔ) for each of the cleaning gases before and after the cleaning step as illustrated in FIG. 11.

As a result of the experiment, it can be visually confirmed that, after the cleaning step, the CD values become larger for the case of the mix of $CF_4$/Ar illustrated in (d) of FIG. 11 than the CD values of the single Ar gas as illustrated in (b) and the CD values of the single HBr gas as illustrated in (c), of FIG. 11.

FIG. 13 is a graph illustrating the difference in CD (CDΔ) of the top CD, the max CD and the bottom CD at the center portion before and after the cleaning as illustrated in FIG. 12. In FIG. 13, the horizontal axis indicates the above described 3 patterns of cleaning gases and the vertical axis indicates CDΔ (nm) of the top CD, the max CD and the bottom CD before and after the cleaning step for the respective cleaning gas.

By referring to FIG. 13, when the single argon gas (Ar) is used, etching mainly by sputtering is performed. Thus, directional etching is performed so that an etching effect to the sidewall of the etching surface becomes small. Further, shoulder portions of the mask member are etched so that etching to an upper portion (top CD) of the element isolation region is difficult.

On the other hand, for the cases of the single hydrogen bromide gas (HBr) and the mix of methane tetrafluoride gas ($CF_4$) and argon gas (Ar), CDΔ (nm) of the top CD, the max CD and the bottom CD before and after the cleaning step are almost the same value and an effect of isotropically etching the sidewall was observed. In particular, it is confirmed that the etching rate of the case of the mix of methane tetrafluoride gas (CF4) and argon gas (Ar) is as four times high as that of the case of the single hydrogen bromide gas (HBr).

The reason for this may be considered that methane tetrafluoride gas ($CF_4$) has a larger reactivity with the residual product $SiO_3$ of the sidewall and silicon Si of the wafer W than hydrogen bromide gas (HBr). However, methane tetrafluoride gas ($CF_4$) has a smaller reactivity with silicon Si than sulfur hexafluoride gas ($SF_6$). Thus, it is revealed that it is preferable to use methane tetrafluoride gas ($CF_4$) by which impacting of fluorine F to the wafer W is small and also having a high etching rate as four times high as that of hydrogen bromide gas (HBr) (in other words, cleaning effect is high) as the cleaning gas.

Further, in this embodiment, it is preferable to perform cleaning by the high frequency for plasma generation HF whose electric power is lower than that of the high frequency for plasma generation applied in the etching step in which the silicon layer is etched at a high speed, that is performed before the cleaning step, in order to suppress impacting to the silicon layer by plasma in the cleaning step.

The method of forming the pattern of the embodiment is described as above. According to the method of forming the pattern, the cleaning step is performed after the etching step in which the silicon layer is etched, for the wafer W of the bonded structure obtained by reversing the wafer W in upward and downward directions and bonding the wafer W to the support substrate, in which the wafer W is cleaned using the cleaning gas obtained by mixing CF series gas and inert-gas. With this, the residual product including the fluorine (F) component generated in the etching step can be removed without damaging components. Thus, decreasing of the electrical characteristics of the image sensors of the CMOS image sensor can be prevented.

Although a preferred embodiment of the method of forming pattern of the embodiment has been specifically illustrated and described, the technical scope of the method of forming pattern of the present invention is not limited to the specifically disclosed embodiments. It is to be understood for the skilled in the art having a normal knowledge about the technology of the method of forming pattern of the present invention that minor modifications may be made therein without departing from the spirit and scope of the invention as defined by the claims and those modifications belong to the technical scope of the method of forming pattern of the present invention.

For example, the substrate to be processed may be a disciform wafer or may be a rectangular substrate. The size (diameter) of the wafer may be 200 mm, 300 mm, or more or equal to 450 mm.

According to the embodiment, it is possible to remove a residual product including a fluorine (F) component generated by etching without causing damage.

What is claimed is:

1. A method of forming a pattern on a silicon layer of a substrate to be processed, comprising:
    a forming step of forming a plurality of semiconductor devices that correspond to a plurality of unit pixels of a solid-state image sensor device at a front surface side of the silicon layer to form the substrate to be processed;
    a forming step of forming a mask having a predetermined pattern on the back surface of the silicon layer;
    an etching step of etching the silicon layer of the substrate from the back surface of the silicon layer by plasma using the mask to form a pattern of a grid-like element isolation region in the silicon layer for isolating the plurality of the semiconductor devices,
        the substrate being supported by a support substrate at a front surface side of the substrate,
        sulfur hexafluoride gas ($SF_6$) being mainly used in the etching step, and a residual product including a fluorine (F) component being deposited at a side surface of the silicon layer of the grid-like element isolation region; and a cleaning step of cleaning the grid-like element isolation region of the silicon layer to remove the residual product by plasma using cleaning gas obtained by mixing methane tetrafluoride gas ($CF_4$) and argon gas (Ar), after the etching step, a process time of the cleaning step being determined such that the residual product is removed.

2. The method of forming the pattern according to claim 1, wherein the process time of the cleaning step is set based on the number of fluorine F in secondary ions from the substrate measured after performing the etching and the cleaning for a predetermined period on the substrate as a test.

3. The method of forming the pattern according to claim 1, wherein in the cleaning step, high frequency whose electric power is lower than that of high frequency for plasma generation applied in the etching step is supplied.

4. The method of forming the pattern according to claim 3, wherein in the cleaning step, the substrate is performed with cleaning by plasma while applying the high frequency for plasma generation whose electric power per unit area is 0.71 $W/cm^2$ to 2.12 $W/cm^2$.

5. A solid-state image sensor device manufactured by the method of forming the pattern according to claim 1.

* * * * *